United States Patent [19]

Rappoport

[11] Patent Number: 5,424,679
[45] Date of Patent: Jun. 13, 1995

[54] +12DB GAIN LINEAR-FADER CONTROL FOR VCA

[75] Inventor: Oren P. Rappoport, Margate, Fla.

[73] Assignee: Sony Electronics Inc., Park Ridge, N.J.

[21] Appl. No.: 201,998

[22] Filed: Feb. 25, 1994

[51] Int. Cl.[6] ............................................. H03G 3/10
[52] U.S. Cl. .................................. 330/138; 330/139; 330/279; 381/109
[58] Field of Search ............... 330/129, 138, 139, 279, 330/280; 381/104, 109

[56] References Cited

U.S. PATENT DOCUMENTS 4,404,429. 9/1983 Griffis .................................. 381/109
5,317,641 5/1994 Yasuda et al. ................... 381/109 X

OTHER PUBLICATIONS

"Audio–Video Reference Manual 1992," Analog Devices, pp. 7-81 to 7-92, 1992.
Sony MXP-S390/S390R, MXP-P390/P390R, Maintenance Manual, p. 6-3, (First Edition).

Primary Examiner—James B. Mullins
Attorney, Agent, or Firm—Ronald P. Kananen

[57] ABSTRACT

Disclosed is a control circuit which provides a control signal to a control terminal of a voltage controlled amplifier (VCA), such as a SSM-2018 VCA manufactured by Analog Devices, such that a signal input to the VCA is amplified between +12 dB gain and full attenuation. The VCA is characterized by a predetermined control attenuation relationship which determines the gain of the input signal. The control circuit includes: a DC voltage source, preferably a linear potentiometer, which provides a voltage in a fixed range; an operational amplifier for rescaling the fixed range of voltages to a second range; a pair of curve-shaping circuits which adjust the second range; and a circuit, including an amplifier circuit, a voltage divider and a zener diode, which adds a DC offset and adapts the signal from the DC voltage source to a range of voltages calculated from the control attenuation relationship. This circuitry permits faster adjustment of the control signal over ranges resulting in full attenuation or +12 dB gain without significant increase in noise and distortion in the signal output from the VCA.

11 Claims, 3 Drawing Sheets

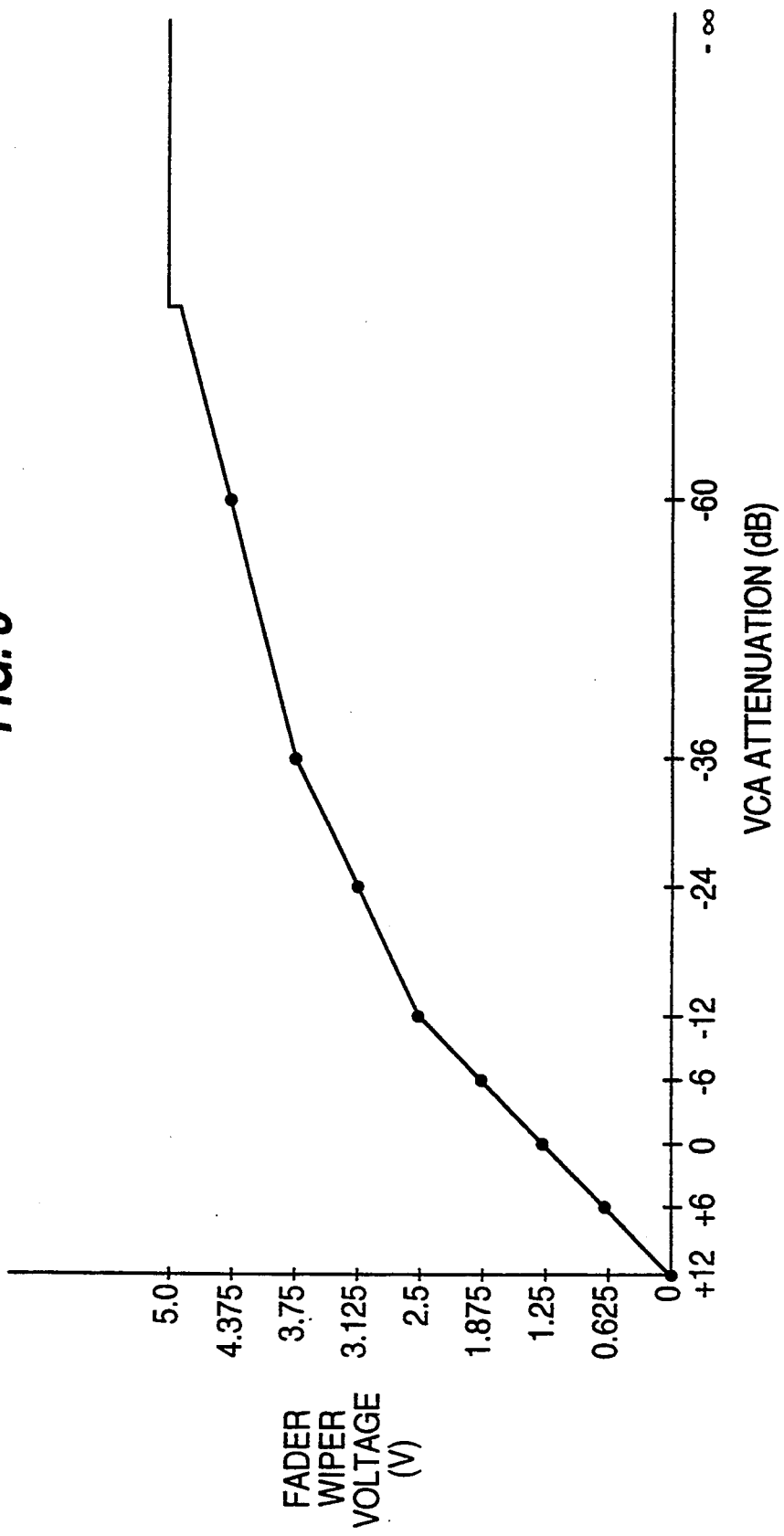

+12DB GAIN LINEAR-FADER CONTROL FOR VCA

CROSS-REFERENCE TO RELATED APPLICATION

Reference is made to commonly-owned patent application entitled "UNITY-GAIN LINEAR-FADER CONTROL FOR VCA", U.S. Ser. No. 08/201,996, filed concurrently herewith.

FIELD OF THE INVENTION

This invention relates to an apparatus for providing +12 dB gain linear-fader control for a voltage-controlled amplifier (VCA). More particularly, it relates to a scaling circuit that provides +12 dB gain at fader maximum.

BACKGROUND OF THE INVENTION

A voltage controlled amplifier amplifies an input signal according to the level of a control signal. The VCA is often used in audio consoles in order to control the gain of an input audio signal. By having the audio signals pass through separate VCAs, the levels of the various audio signals, and therefore the mix of the signals, may be selectively controlled by varying the control voltages applied to the respective VCAs. Also, the control voltage may be varied in order to fade the audio signal either in or out. For example, to perform a fade operation, an input audio signal may be fully attenuated with the VCA (zero gain) or amplified to a desired level. In many operations, it is desirable to adjust the gain from full attenuation to a predetermined level. In many audio applications, such as audio mixing, it desirable to vary an signal from full attenuation to +12 dB.

Typically, the control signal supplied to the VCA is output from a "VCA-taper" potentiometer (a "fader"). The fader may be manually adjusted to permit direct control of the VCA's processing of the input audio signal. Alternatively, the fader signal may be supplied automatically by other switching devices. A control circuit in which two manually adjusted faders are used to control a voltage control signal input to a VCA is described in commonly-owned U.S. Pat. No. 5,317,641 entitled "Fader Depth Control Apparatus", U.S. Ser. No. 07/683,887. The control circuit of this application has been applied so as to supply a 0 to 5 VDC control level to a DBX 2155 VCA.

A newer and particularly useful VCA device for amplifying an input audio signal under control of a fader voltage is available from Analog Devices as model number SSM-2018. According to the manufacturer's specifications, this component has a characteristic attenuation law of −28 mV/dB. Thus, this relationship determines the particular control voltage required to be input in order to achieve the desired level of attenuation of an input signal.

A recommended application circuit 1 for the SSM-2018 is shown in FIG. 1. Among the other components shown, this circuit includes a time constant comprised of resistors 2 and 2A and a capacitor 4. Together these elements provide a time constant of approximately 5 ms in the control signal path which leads to the control voltage pin 11. This time constant is provided so as to suppress audible noise and distortion. The manufacturer further recommends the use of a larger capacitor (of 10 $\mu$F to 20 $\mu$F) to improve low frequency distortion. Such capacitors increase the time constraint to between approximately 50 ms to 100 ms.

When such a simple time constant is coupled to the control signal path as shown, it limits the bandwidth of the control signal. This is undesirable in many applications where a higher-frequency control signal is used. For example, the recommended time circuit may limit operation where the control signal is varied automatically at relatively high speeds. While the time constant may be changed to improve speed, this may result in increased levels of distortion and noise being introduced into the VCA circuitry thereby limiting performance.

Accordingly, there is a need for an improved circuit for providing a control signal to a VCA, such as the SSM-2018, to thereby adjust an input audio signal between full attenuation and +12 dB gain.

There is an additional need to ensure that such an improved control circuit may be manufactured economically. Specifically, there is a need that relatively few components be used, and that such components be inexpensive and widely available.

SUMMARY OF THE INVENTION

It is an object of the invention to provide a circuit which meet these and other needs. Accordingly, there is described a control circuit which provides a control signal to a control terminal of a voltage controlled amplifier (VCA) characterized by a predetermined control attenuation relationship, the VCA adjusting the amplitude of an audio signal output from the VCA according to the control signal. This control circuit comprises: means for providing a first DC voltage, the DC voltage being limited to a value in a first range of voltages between a first voltage and a second voltage; means for scaling the first range of voltages to a second range of voltages, the means for scaling providing a second DC voltage; curve-shaping means for adjusting the second DC voltage and outputting an adjusted voltage, the adjustment occurring at least one voltage level within the second range of voltages; and a circuit for adapting the adjusted voltage to a control level according to the control level attenuation relationship and for adding a DC offset voltage to the adjusted voltage, the circuit providing the control voltage to the control terminal, wherein the adapting circuit includes an amplifier circuit which amplifies the adjusted voltage and adds the DC offset voltage to the adjusted voltage and a scaling network which limits the output from the amplifier circuit. According to the invention, the adapting circuit limits the control output to a range between a first value corresponding to +12 dB gain according to the predetermined control attenuation relationship and a second value corresponding to maximum attenuation according to the predetermined control attenuation relationship.

BRIEF DESCRIPTION OF THE DRAWINGS

FIG. 3 is a graph showing the amplification of a VCA over a range of fader voltages according to the present invention.

DETAILED DESCRIPTION OF THE PREFERRED EMBODIMENTS

Figure 2:
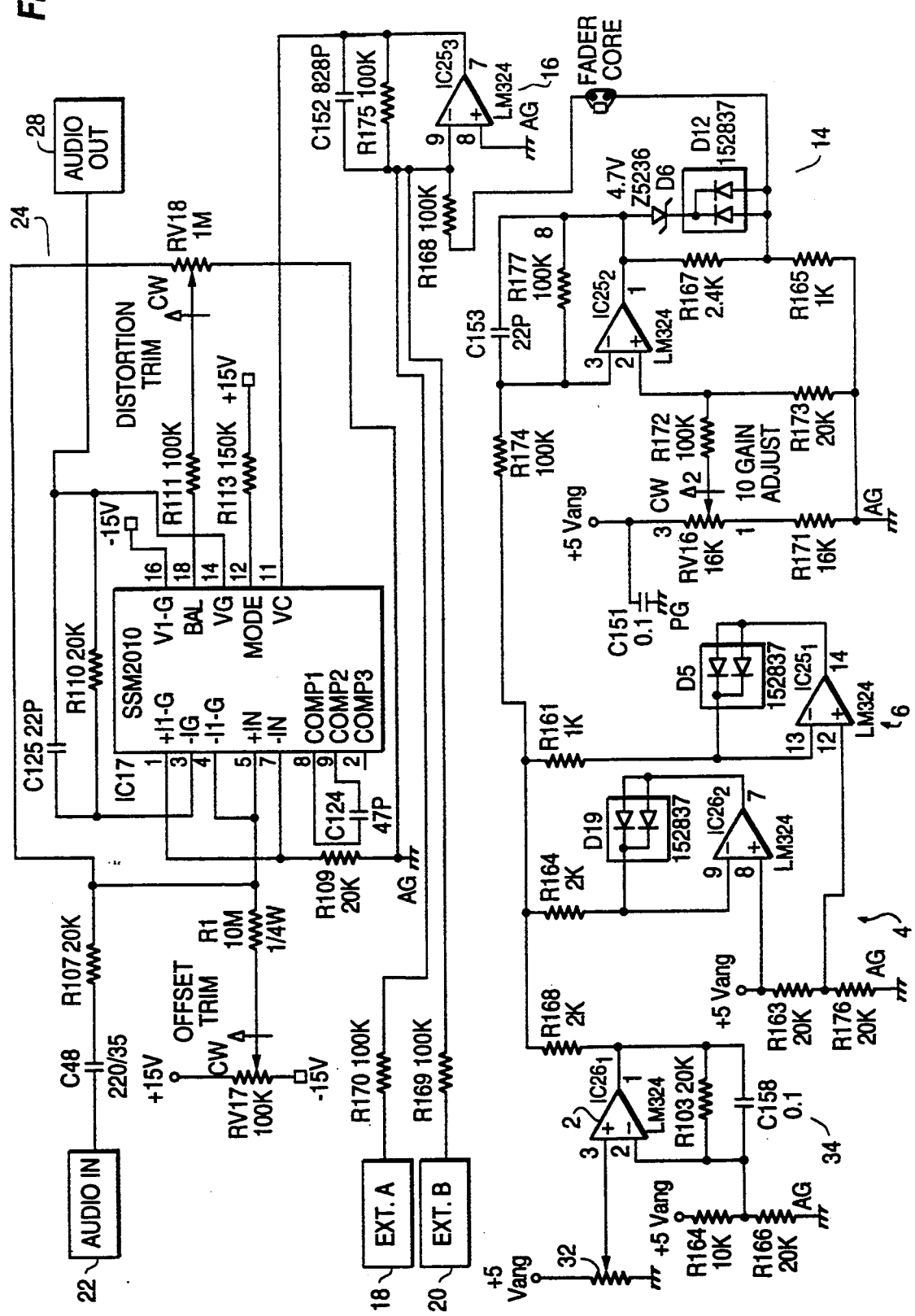
FIG. 2 is a circuit diagram according to an embodiment of the invention.

FIG. 2 shows a circuit diagram of a preferred embodiment of the invention. This circuit includes several subarrangements 2, 4, 6, 8, 10, 14 and 16 which together provide a control signal to a VCA 30. In this discussion of the preferred embodiment, the VCA used was a SSM-1018. As mentioned above, according to the manufacturer's specification, this component has an attenuation relationship of −28 mV/dB. In practice, it has been discovered that this relationship is actually closer to −30 mV/dB. Thus, as discussed herein, the subarrangements form a relatively inexpensive control circuit which attenuate an audio signal input into the VCA 30 over a range from full attenuation to +12 dB gain according to the actual attenuation relationship.

As shown, the first subarrangement 2 includes a fader (a linear potentiometer) 32 which provides an adjustable voltage which varies between a lower range and an upper range. Such a component is used because of its low cost and widespread availability. In this example, the fader voltage varies between zero and +5 V. As mentioned above, the fader 32 shown in FIG. 2 may be adjusted manually, or instead an automatically adjusted signal may be supplied.

The fader voltage is input to a noninverting amplifier circuit comprised of resistors $R_{164}$, $R_{166}$, $R_{183}$, capacitor $C_{158}$, voltage source $V_{ang}$ and operational amplifier $IC26_1$. Specifically the fader voltage, $V_{fader}$ is input to the noninverting input of the operational amplifier $IC26_1$. The components of the noninverting amplifier circuit are selected so as to offset the fader voltage by a predetermined level. For example, by selecting values for the resistors of $R_{166}=R_{183}=2(R_{164})$ and $V_{ang}=+5$ VDC, the range of DC fader voltages of 0 to +5 V is offset to an output voltage in a range of −10 V to +10 V.

This range of voltages, output from pin 1 of $IC26_1$, is coupled via a 2 kΩ resistor $R_{180}$ to two curve shaping circuits 4 and 6 as shown. The first of these circuits 2 includes resistor $R_{184}$, operational amplifier $IC26_2$ and diode $D_{19}$. Operational amplifier $IC26_2$ and diode $D_{19}$ together form an "ideal diode" in that diode $D_{19}$ is in the feedback loop of operational amplifier $IC26_2$. The noninverting input of the operational amplifier is held at the voltage $V_{ang}$. Because the diode $D_{19}$ is arranged between the noninverting input and the output of the operational amplifier $IC26_2$, the diode $D_{19}$ becomes active at +5 V, thereby shaping the curve of the voltage output from pin 1 of operational amplifier $IC26_1$.

The second curve shaping circuit is arranged in a similar manner. According to this arrangement, the noninverting input of operational amplifier $IC25_1$ is coupled to a voltage divider consisting of $R_{163}$ and $R_{176}$. This voltage divider provides an input voltage of, for example $\frac{1}{2}(V_{ang})$. Thus, the diode $D_5$ becomes active at this voltage. In this example, the diode $D_5$ becomes active at 2.5 V, thereby further shaping the output of the operational amplifier $IC26_1$.

This output is further coupled to a circuit 8 which adapts the voltage signal to the control port attenuation characteristics of the VCA, and further adds a DC offset voltage to the signal from the subarrangement 2 so that the control circuit may be used to provide gain. In this example, the voltage signal is applied via a resistor $R_{174}$ to the inverting input of an operational amplifier $IC25_2$. This input is coupled through a resistor $R_{177}$ and a capacitor $C_{153}$ arranged in a feedback loop between the operational amplifier output and the inverting input. The resistors $R_{174}$ and $R_{177}$ have equal values. In this example, the resistors have values of 100 kΩ and the capacitor $C_{153}$ a value of 22 pF.

The noninverting input of $IC25_2$ is connected to a second feedback loop consisting of resistors $R_{173}$, $R_{165}$ and $R_{167}$. The first resistor in this loop $R_{173}$ is connected between the noninverting input and ground. In this example, $R_{173}$ has a value of 20 kΩ, $R_{165}$ has a value of 1 kΩ, and $R_{167}$ has a value of 2.4 kΩ. When utilized with a SSM-2018 VCA, resistors $R_{297}$ and $R_{304}$ having these values provides the proper scaling.

The output from $IC25_2$ is connected via a zener diode $D_6$ and a diode $D_{12}$ to a point between the resistors $R_{165}$ and $R_{167}$. The two resistors form a voltage divider by which proper scaling of the output from the operational amplifier $IC25_2$ is achieved. Further, the second feedback loop provides a DC offset voltage which adjusts the value of the control signal such that gain as well as attenuation is available.

The zener diode $D_6$ provides a simple way of improving the "fader kill" of the control signal, that is, increasing maximum attenuation by increasing the dividing ratio of the voltage divider network comprised of resistors $R_{165}$ and $R_{167}$. The dividing ratio is increased when the zener diode $D_6$ enters its zener region. In this example, a zener value of 4.7 V was selected experimentally. The diode $D_{12}$ permits positive as well as negative control voltages.

Additionally, a gain adjustment network 10 is coupled to the circuit 8 via the noninverting input of the operational amplifier $IC25_2$. This circuit provides an additional adjustment to the DC offset voltage by which the gain provided by the VCA 30 can be further adjusted. Arranged as shown, this network includes a fader RV16 which coupled between a positive voltage supply $+V_{ang}$ and one terminal of a resistor $R_{171}$. The second terminal of this resistor is coupled to ground. A capacitor $C_{151}$ is further added to couple the positive voltage side of the fader RV16 to ground. The adjustable voltage form the fader RV16 is coupled to the noninverting input of the operational amplifier $IC25_2$ via a resistor $R_{172}$. According to this arrangement, the following values results in a gain adjustment of about ±2 dB: $V_{ang}=+5$ V, $RV_{15}=10$ kΩ, $R_{171}=10$ kΩ, $R_{172}=100$ kΩ.

The signal from the zener diode and the voltage divider is input to the inverting input of an operational amplifier $IC25_3$ via a resistor $R_{158}$. In this example, $R_{158}$ has a value of 100 kΩ. The noninverting input of this operational amplifier is coupled to ground, while the inverting input is further coupled to the output via resistor $R_{175}$ and capacitor $C_{152}$. By using a resistor $R_{175}$ having a value equal to $R_{158}$, this arrangement sums the signal from the zener diode and the divider with other control signals 18 and 20 generated elsewhere.

Figure 1:
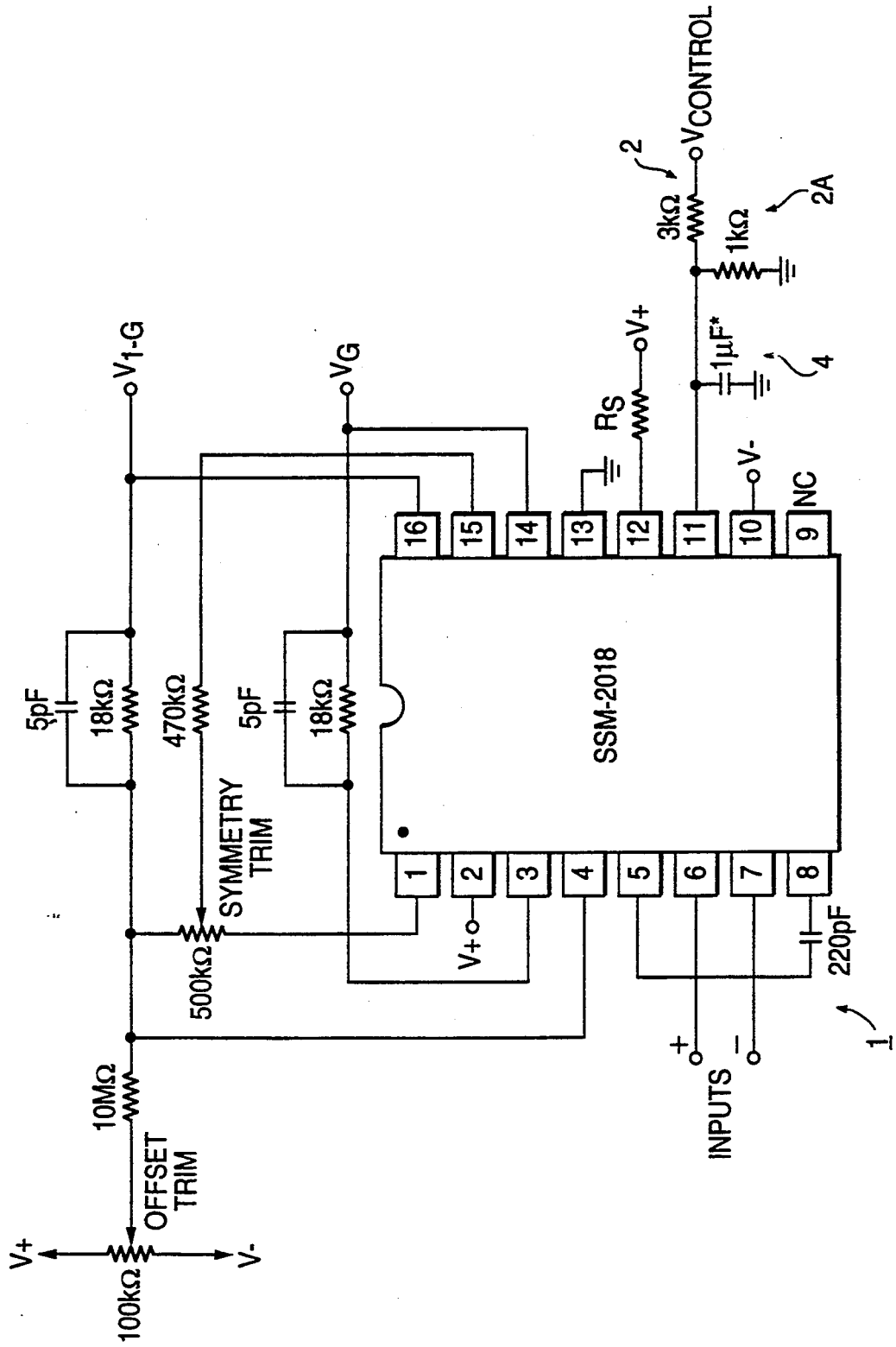
FIG. 1 is a diagram according to the prior art of an application circuit for a SSM-2018 VCA.

In the preferred embodiment, $R_{175}$ has a value of 100 kΩ and $C_{220}$ has a value of 820 pF. This provides an angular frequency of 12,195 rad/s, that is a frequency response of 1941 Hz or a response time of 0.51 ms. This response time is approximately ten times faster than the prior art circuit of FIG. 1 and does not introduce the noise and distortion that would be introduced simply by adjusting the value of the capacitor 4 of the prior art control circuit.

The output from this circuit may be input directly to the control pin #11 of a VCA 30, such as the SSM-2018. When properly biased, this control voltage provides amplification of an input audio signal which is input via pin 6 as shown. The remaining circuit elements of the subarrangement 24 provide proper trimming of the VCA 30, in accordance with the manufacturer's instruction. By this arrangement, an audio input 22 may be amplified via the VCA 30 according to a control signal from the output of operational amplifier IC25$_3$. The amplified signal may then be transmitted to other circuit arrangements from the audio output 28.

The resulting relationship between the fader voltage range of 0 V to +5 V and the attenuation of the input signal is shown in FIG. 3 in which the values shown correspond to those obtained with the specific components discussed above. As shown, the fader voltage V provides an attenuation ranging from +12 dB to full attenuation ($-\infty$).

Thus, the control circuit according to the invention provides the desired range of control signals for the control port of a selected VCA, such as the SSM-2018. The bandwidth of this control signal is greatly improved over the prior art, thereby permitting high speed operation. Moreover, this improvement in bandwidth is accomplished without an increase in noise and distortion and without a high cost.

The foregoing is a detailed description of the preferred embodiments. The scope of the invention, however, is not so limited. Various alternatives will be readily apparent to one of ordinary skill in the art. The invention is only limited by the claims appended hereto.

What is claimed is:

1. A control circuit for providing a control signal to a control terminal of a voltage controlled amplifier (VCA) characterized by a predetermined control attenuation relationship, the VCA adjusting the amplitude of an audio signal output from the VCA according to said control signal, said control circuit comprising:

means for providing a first DC voltage, said DC voltage being limited to a value in a first range of voltages between a first voltage and a second voltage;

means for scaling said first range of voltages to a second range of voltages, said means for scaling providing a second DC voltage;

curve-shaping means for adjusting said second DC voltage and outputting an adjusted voltage, said adjustment occurring at a predetermined voltage level within said second range of voltages; and a circuit for adapting said adjusted voltage to a control level according to said control level attenuation relationship and for adding a DC offset voltage to said adjusted voltage, said circuit providing said control voltage to said control terminal, wherein said adapting circuit includes a first amplifier circuit which amplifies said adjusted voltage and adds said DC offset voltage to said adjusted voltage and a scaling network which limits the output from said first amplifier circuit;

wherein said adapting circuit limits said control output to a range between a first value corresponding to +12 dB gain according to said predetermined control attenuation relationship and a second value corresponding to maximum attenuation according to said predetermined control attenuation relationship; and further comprising a second amplifier circuit having an input coupled to said scaling network and an output coupled to said control terminal, said second amplifier circuit having a response time of less than 5 milliseconds.

2. The control circuit of claim 1 wherein the VCA is a model SSM-2018 VCA.

3. The control circuit of claim 2 wherein said first voltage is 0 V and said second voltage is +5 V.

4. The control circuit of claim 1, wherein said scaling network includes a voltage divider network coupled to an output of said amplifier circuit, the output of said voltage divider network providing said control signal, and further includes a zener diode arranged between the output of said first amplifier circuit and the output of said voltage divider network.

5. The control circuit of claim 4 further comprising a diode arranged in series with said zener diode, said diode permitting negative and positive voltages to be supplied from the output of said first amplifier.

6. The control circuit of claim 4 wherein the VCA is a model SSM-2018 VCA.

7. The control circuit of claim 6 wherein said first voltage is 0 V and said second voltage is +5 V.

8. The control circuit of claim 4 wherein said first amplifier circuit has an adjustable gain.

9. The control circuit of claim 4 wherein said means for scaling comprises an operational amplifier arranged in a noninverting amplifier circuit.

10. The control circuit of claim 1 wherein said first amplifier circuit has an adjustable gain.

11. The control circuit of claim 1 wherein said means for scaling comprises an operational amplifier arranged in a noninverting amplifier circuit.

* * * * *